US012782396B2

(12) United States Patent
Kramm et al.

(10) Patent No.: US 12,782,396 B2
(45) Date of Patent: Nov. 3, 2026

(54) CURRENT MEASURING RESISTOR USING A RESISTOR ELEMENT FORMED BETWEEN TWO CONDUCTION ELEMENTS WITH AN ASSOCIATED CIRCUIT BOARD AND METHOD OF MAKING THE SAME

(71) Applicant: Isabellenhuette Heusler GmbH & Co. KG, Dillenburg (DE)

(72) Inventors: Benedikt Kramm, Wettenberg (DE); Florian Bernhardt, Dillenburg-Manderbach (DE); Felix Lebeau, Herborn (DE); Michael Pollmann, Dillenburg (DE); Jan Sattler, Haiger (DE); Paul Kalemba, Herborn (DE); Arno Fey, Dillenburg (DE); Daniel Langhammer, Dillenburg (DE)

(73) Assignee: ISABELLENHUETTE HEUSLER GMBH & CO. KG, Dillenburg (DE)

( * ) Notice: Subject to any disclaimer, the term of this patent is extended or adjusted under 35 U.S.C. 154(b) by 85 days.

(21) Appl. No.: 18/725,453

(22) PCT Filed: Mar. 29, 2023

(86) PCT No.: PCT/EP2023/058185

§ 371 (c)(1),
(2) Date: Jun. 28, 2024

(87) PCT Pub. No.: WO2023/202855

PCT Pub. Date: Oct. 26, 2023

(65) Prior Publication Data

US 2025/0102542 A1 Mar. 27, 2025

(30) Foreign Application Priority Data

Apr. 22, 2022 (DE) ........................ 102022109708.0

(51) Int. Cl.
*G01R 15/14* (2006.01)

(52) U.S. Cl.
CPC .................................. *G01R 15/146* (2013.01)

(58) Field of Classification Search
CPC .... G01R 1/203; G01R 19/32; G01R 19/0092; G01R 11/185; G01R 15/146;
(Continued)

(56) References Cited

U.S. PATENT DOCUMENTS 4,191,920 A * 3/1980 Guttenplan ............ G01N 27/66 324/459
10,163,553 B2 * 12/2018 Kameko ................ H01C 17/28
(Continued)

FOREIGN PATENT DOCUMENTS

CN 110320404 A 10/2019
DE 102006019895 A1 11/2007
(Continued)

OTHER PUBLICATIONS

International Search Report from corresponding PCT Application No. PCT/EP2023/058185 dated Jul. 10, 2023.

*Primary Examiner* — Vinh P Nguyen
(74) *Attorney, Agent, or Firm* — Caesar Rivise, PC

(57) ABSTRACT

A current measuring device for measuring an electric current (I). The current measuring device includes a current measuring resistor with two connection parts made of a conductor material and a resistor element made of a resistance material. Furthermore, the current measuring device may include a circuit board which is electrically connected to the two connection parts of the current measuring resistor at at least two connection points. The current measuring device provides that the connection parts of the current measuring resistor are each connected to the circuit board at the connection points via a press connection with a material
(Continued)

bond. Furthermore, a method for producing the current measuring device is included.

22 Claims, 13 Drawing Sheets

(58) Field of Classification Search
CPC ...... G01R 19/165; G01R 27/08; H05K 3/341; H05K 2201/10151; G01K 7/16; G01K 7/12; G01N 21/956
See application file for complete search history.

(56) References Cited

U.S. PATENT DOCUMENTS

| | | | | |
|---|---|---|---|---|
| 11,293,952 | B2 | 4/2022 | Mueller et al. | |
| 11,555,831 | B2 * | 1/2023 | Wyatt | G01R 1/203 |
| 11,821,922 | B2 * | 11/2023 | Thumm | G01R 1/203 |
| 2003/0222511 | A1 | 12/2003 | Hetzler | |
| 2015/0022225 | A1 * | 1/2015 | Onimaru | G01R 19/0092 324/713 |
| 2016/0041206 | A1 | 2/2016 | Hetzler | |
| 2020/0158758 | A1 * | 5/2020 | Nakagawa | G01R 19/0092 |
| 2021/0225565 | A1 | 7/2021 | Wolf et al. | |
| 2021/0382092 | A1 * | 12/2021 | Thumm | G01R 15/146 |
| 2022/0057436 | A1 | 2/2022 | Wyatt et al. | |

FOREIGN PATENT DOCUMENTS

| | | | |
|---|---|---|---|
| DE | 102010010152 | A1 | 10/2010 |
| DE | 10 201112190 | A1 * | 6/2013 |
| DE | 102020003458 | A1 | 12/2021 |
| DE | 102021103241 | A1 | 8/2022 |
| EP | 0605800 | B1 | 3/1996 |
| EP | 1363131 | A1 | 11/2003 |
| WO | WO2014161624 | A1 | 10/2014 |

* cited by examiner

CURRENT MEASURING RESISTOR USING A RESISTOR ELEMENT FORMED BETWEEN TWO CONDUCTION ELEMENTS WITH AN ASSOCIATED CIRCUIT BOARD AND METHOD OF MAKING THE SAME

CROSS-REFERENCE TO RELATED APPLICATIONS

This application is a U.S. National Phase Application of PCT/EP2023/058185, filed Mar. 29, 2023, which claims priority to German Patent Application No. 10 2022 109 708.0, filed Apr. 22, 2022, which is incorporated by reference herein in its entirety.

TECHNICAL FIELD OF THE INVENTION

The invention relates to a current measuring device for measuring an electric current according to the four-wire technique with a low-resistance current measuring resistor and a circuit board connected to the current measuring resistor. The invention also relates to a corresponding production method for manufacturing such a current measuring device.

BACKGROUND OF THE INVENTION

It is known from the state of the art (e.g. EP 0 605 800 B1) to measure an electric current using the four-wire technique. Here, the electrical current to be measured is passed through a low-resistance current measuring resistor ('shunt') and the electrical voltage dropping across the current measuring resistor is measured. In accordance with Ohm's law, the measured voltage then forms a measure of the electrical current flowing through the low-resistance current measuring resistor.

It is also known from the state of the art to permanently connect a circuit board (PCB: Printed Circuit Board) to the current measuring resistor, whereby a measuring circuit is arranged on the PCB which measures the voltage drop across the low-ohmic current measuring resistor. For example, the measuring circuit may be an application-specific integrated circuit (ASIC: application-specific integrated circuit), such as that known from EP 1 363 131 A1.

Firstly, the circuit board with the measuring circuit must be electrically connected to the current measuring resistor in order to be able to measure the voltage drop across the resistor element of the low-resistance current measuring resistor. This electrical connection can be made using a soldered connection, for example.

On the other hand, the circuit board with the measuring circuit must also be mechanically connected to the current measuring resistor, which is typically done differently in order to achieve the required mechanical resilience of the mechanical connection.

A disadvantage of the known current measuring device described above is therefore the connection between the circuit board on the one hand and the current measuring resistor on the other, which is not yet completely satisfactory. For example, the soldered connections between the circuit board and the current measuring resistor have a relatively large spatial extent, which makes it difficult to measure the voltage at the connection parts of the current measuring resistor with pinpoint accuracy.

For the general technical background of the invention, reference should also be made to DE 10 2010 010 152 U1, DE 10 2020 003 458 A1 and DE 10 2006 019 895 A1.

SUMMARY

The invention is therefore based on the task of creating a correspondingly improved current measuring device and a corresponding manufacturing process for it.

This task is solved by a current measuring device according to the main claim of the invention and by a corresponding production method according to the independent claim.

The current measuring device according to the invention is used to measure an electric current and for this purpose, in accordance with the known current measuring device described at the beginning, firstly comprises a low-resistance current measuring resistor.

In accordance with the known current measuring resistor described at the beginning, the current measuring resistor comprises two connection parts made of a conductor material (e.g. copper) in order to introduce the electrical current to be measured into the current measuring resistor or to conduct it out of the current measuring resistor.

A low-resistance resistor element consisting of a low-resistance resistance material (e.g. Manganin®) is arranged in the direction of current flow between the two connection parts and is traversed by the electric current to be measured during a measurement. Such current measuring resistors are known from the prior art (e.g. EP 0 605 800 B1).

It should be mentioned here that the invention is not limited to copper with regard to the conductor material of the connection parts, but can also be realised with a copper alloy, aluminium or an aluminium alloy as conductor materials, for example.

It should also be mentioned that the invention is also not limited to Manganin® with regard to the resistance material. Thus, the invention can also be realized with other resistance alloys, as will be described in detail.

Furthermore, in accordance with the known current measuring device described at the beginning, the current measuring device according to the invention comprises a circuit board which is connected to the two connection parts of the current measuring resistor at at least two connection points.

The current measuring device according to the invention is now characterized by the fact that the connection between the circuit board on the one hand and the current measuring resistor on the other hand is made by a press connection, which creates a material bond between the circuit board and the current measuring resistor.

In one variant of the invention, the press connection is a press-sinter connection. Such press-sinter connections are known per se from the prior art and therefore need not be described in detail. At this point, it should only be mentioned that the press-sinter connection can optionally contain an additional sinter material, such as silver or copper.

In another variant of the invention, on the other hand, the press connection is a press-adhesive connection which can, for example, contain an epoxy adhesive as the adhesive.

In both variants (press-sinter connection and press-adhesive connection), the joining partners (connection parts of the current measuring resistor and/or circuit board) can have a surface structuring at the connection points, for example a nano-structuring. The surface structuring can have material elevations on the surface of the joining partners, which are subjected to pressure during the pressing process and then produce the desired press connection locally at these points, while the space between the material elevations is not pressed, so that no press connection is produced at these points. This surface structuring makes it possible to limit the spatial extent of the press connection, which enables precise voltage measurement on the connection parts. For example, the individual crimped connections can each have a horizontal extension parallel to the circuit board that is at most 1 mm, 500 μm, 250 μm or 100 μm, which enables precise voltage measurement at the connection parts.

It should also be mentioned that the surface structuring can contain one or more of the following materials:

- ENIG ('Electroless Nickel Immersion Gold'),
- ENEPIG ('Electroless Nickel Electroless Palladium Immersion Gold'),
- gold,
- copper,
- nickel-phosphorus,
- silver.

In practice, the above-mentioned press connection between the circuit board and the current measuring resistor according to the invention establishes both a mechanical connection and an electrical connection. It is possible to electrically decouple the mechanical connection from the electrical connection. For example, this can be achieved by the above-mentioned surface structuring with material elevations on the surface of the joining partners (circuit board and connection parts of the current measuring resistor). The press connection is then only made in the area of the material elevations. The material elevations can then be spatially separated from each other, with one material elevation creating the mechanical connection while another material elevation creates the electrical connection.

In a preferred embodiment of the invention, the circuit board for contacting the current measuring resistor has several contact fingers that protrude from the circuit board.

For example, these contact fingers can be produced by making slots in the side of the circuit board, which then separate the contact fingers from one another. The contact fingers therefore preferably protrude from the circuit board in the same direction and parallel to each other.

The contact fingers on the circuit board can then contact the current measuring resistor on its upper side and/or underside.

It should be mentioned here that the current measuring resistor can have recesses ('uncoverings') into which one of the contact fingers of the circuit board can protrude. In the area of these recesses, the current measuring resistor then has a reduced thickness compared to the rest of the current measuring resistor. By adjusting the depth of the recesses, the temperature coefficient (TCR: temperature coefficient of resistance) of the resistance value of the current measuring resistor can also be adjusted.

In one embodiment of the invention, there is a recess in each of the two connection parts of the current measuring resistor for one of the contact fingers of the circuit board. These recesses are preferably adjacent to the resistor element, but it is also possible for the recesses to extend into the resistor element. It should also be mentioned that the recesses in the connection parts of the current measuring resistor preferably extend from a side edge of the current measuring resistor, so that the contact fingers of the circuit board can be orientated at right angles to the current measuring resistor and extend from the side into the recesses in the connection parts of the current measuring resistor.

Furthermore, within the scope of the invention, it is also possible that a recess for one of the contact fingers of the circuit board is also located in the resistor element of the current measuring resistor, this recess preferably being arranged on the same side edge of the current measuring resistor as the recesses in the connection parts of the current measuring resistor. One of the contact fingers of the circuit board then protrudes into the recesses in the resistor element, which enables a center tap. However, it should be mentioned here that the center tap on the resistor element is only optional.

Furthermore, it is possible that at least one of the contact fingers of the circuit board contacts the current measuring resistor on its underside, while the other contact fingers can contact the current measuring resistor on its upper side.

In the preferred embodiment of the invention, the circuit board is fitted with at least one electrical or electronic component. In this case, it is possible that this component is also connected to the circuit board by a press connection, in particular by a press-sinter connection or by a press-adhesive connection. The idea of a press connection according to the invention is therefore not limited to the connection between the circuit board and the current measuring resistor, but can also be used for the connection between the circuit board and the components located thereon.

For example, the circuit board can be fitted with at least one of the following components:

- Analog-digital converter,
- component for potential-separated data transmission,
- microprocessor,
- interface for transmitting measured values to an external evaluation unit.

With regard to the microprocessor, it should be mentioned that it can be arranged either on the high side or on the low side of the module for electrically potential-separated data transmission.

It has already been mentioned at the beginning that the current measuring device according to the invention enables current measurement according to the four-wire technique. In this case, the voltage dropping across the resistor element of the current measuring resistor is measured at two connection points on the connection elements of the current measuring resistor. From the voltage across the resistor element measured in this way, the current flowing through the current measuring resistor can then be calculated according to Ohm's law. In the context of the invention, this voltage can also be measured at more than two connection points. For example, the circuit board can be connected to the two connection parts of the current measuring resistor at at least four connection points in order to measure the voltage dropping across the resistor element at several points. For example, the four connection points can form a rectangle, whereby the connection points can each form several measuring channels in pairs, whereby the measuring channels each measure the voltage between the two connection parts of the current measuring resistor.

The connection points of the two measuring channels can be arranged crosswise, as is known, for example, from DE 10 2021 103 241.5. Alternatively, it is possible for the connection points of the two measuring channels to be arranged in parallel, as is known, for example, from WO 2014/161624 A1.

In a simple embodiment of the invention, however, the circuit board is only connected at two connection points to the two connection parts of the current measuring resistor in order to measure the voltage dropping across the resistor element of the current measuring resistor. A center tap can optionally be provided here by also connecting the circuit board to the resistor element.

In another variant, three connection points can be provided to connect the circuit board to the connection parts, whereby the three connection points form a closed voltage mesh.

It should also be mentioned that the circuit board can also contain an interface in order to transmit measured values of the voltages dropping between the connection parts and/or measured values of a temperature sensor arranged on the circuit board to an external evaluation unit via the interface, the interface preferably being an analog interface.

Alternatively, within the scope of the invention, it is possible for the circuit board to carry an evaluation unit which calculates the electrical current flowing through the current measuring resistor from the measured values of the voltage dropping between the connection parts. The evaluation unit can optionally be connected to a temperature sensor on the circuit board and take the temperature into account when calculating the current flowing through the current measuring resistor for temperature correction. The circuit board can optionally also have a digital interface that is connected to the evaluation unit on the circuit board in order to output the electrical current calculated by the evaluation unit. In addition, the actual measured values of the measured voltage and the measured temperature can also be transmitted via the digital interface.

In the context of the invention, the circuit board can be a rigid circuit board, as is known per se from the prior art. Such circuit boards can, for example, be made of glass fiber composite material. In a preferred embodiment of the invention, however, the circuit board is a flexible circuit board (FPC: Flexible Printed Circuit). Furthermore, there is also the possibility of a hybrid circuit board that is partially flexible and partially rigid, whereby such circuit boards are also referred to as rigid-flex circuit boards.

It should also be mentioned that the current measuring resistor is preferably of low resistance with an electrical resistance of at most 10μΩ, 25μΩ, 50μΩ, 100μΩ, 200μΩ or 500 μΩ.

Furthermore, the current measuring resistor can have a current carrying capacity of at least 100 A, 200 A, 500 A, 1 kA, 2 kA or 5 kA.

In general, it should also be mentioned that the connection parts of the current measuring resistor, the resistive element of the current measuring resistor or the current measuring resistor as a whole are preferably plate-shaped, in particular flat or bent.

Within the scope of the invention, the resistor element of the current measuring resistor can have a smaller thickness than the connection parts of the current measuring resistor.

Furthermore, it should be noted that in the current measuring resistor, the resistor element can be connected to the connection parts by a welded connection, in particular by electron beam welding.

The invention also makes it possible for the current measuring resistor to have an electrical resistance value with a temperature coefficient of at most 200 ppm/K, 100 ppm/K, 50 ppm/K, 20 ppm/K or 10 ppm/K.

It should also be mentioned that the conductor material of the connection parts of the current measuring resistor can be copper, a copper alloy, aluminium or an aluminium alloy.

For example, the resistance material of the resistor element of the current measuring resistor can be one of the following alloys:

- a copper alloy, in particular a copper-manganese alloy, in particular CuMn12Ni2 or CuMn7Sn2,3, or a copper-manganese-nickel alloy, in particular Cu84Ni4Mn12 or Cu65Mn25Ni10, or a copper-chromium alloy,
- a nickel alloy, in particular NiCr or CuNi.

However, the conductor material of the connection parts of the current measuring resistor should have a lower specific electrical resistance than the resistance material of the resistor element of the current measuring resistor.

It should also be mentioned that the current measuring resistor preferably has a length in the range of 5 mm-200 mm along the main current flow direction. The width of the current measuring resistor transverse to the main current flow direction, on the other hand, is preferably in the range of 10 mm-100 mm, while the current measuring resistor preferably has a thickness in the range of 1 mm-5 mm.

It should also be mentioned with regard to the press connections according to the invention that these can have a very low electrical contact resistance, which is preferably less than 1 $\mu\Omega/mm^2$.

In addition to the current measuring device according to the invention described above, the invention also claims protection for a corresponding production method, whereby the individual process steps of the production method according to the invention are already apparent from the above description of the current measuring device according to the invention and therefore need not be described again separately.

It should only be mentioned that during the production of the press-sintering temperature, heat is preferably applied to the connection points in order to heat them to a sintering temperature. This sintering temperature is preferably below the melting temperature of the conductor material and also below the melting temperature of the resistance material. The sintering temperature can therefore be in the range of 100° C. to 500° C., for example.

In the case of the press-adhesive connection according to the invention, on the other hand, preferably no heat input takes place.

Other advantageous further embodiments of the invention are characterized in the dependent claims or are explained in more detail below together with the description of the preferred embodiments of the invention with reference to the figures.

DETAILED DESCRIPTION

Figure 1A:
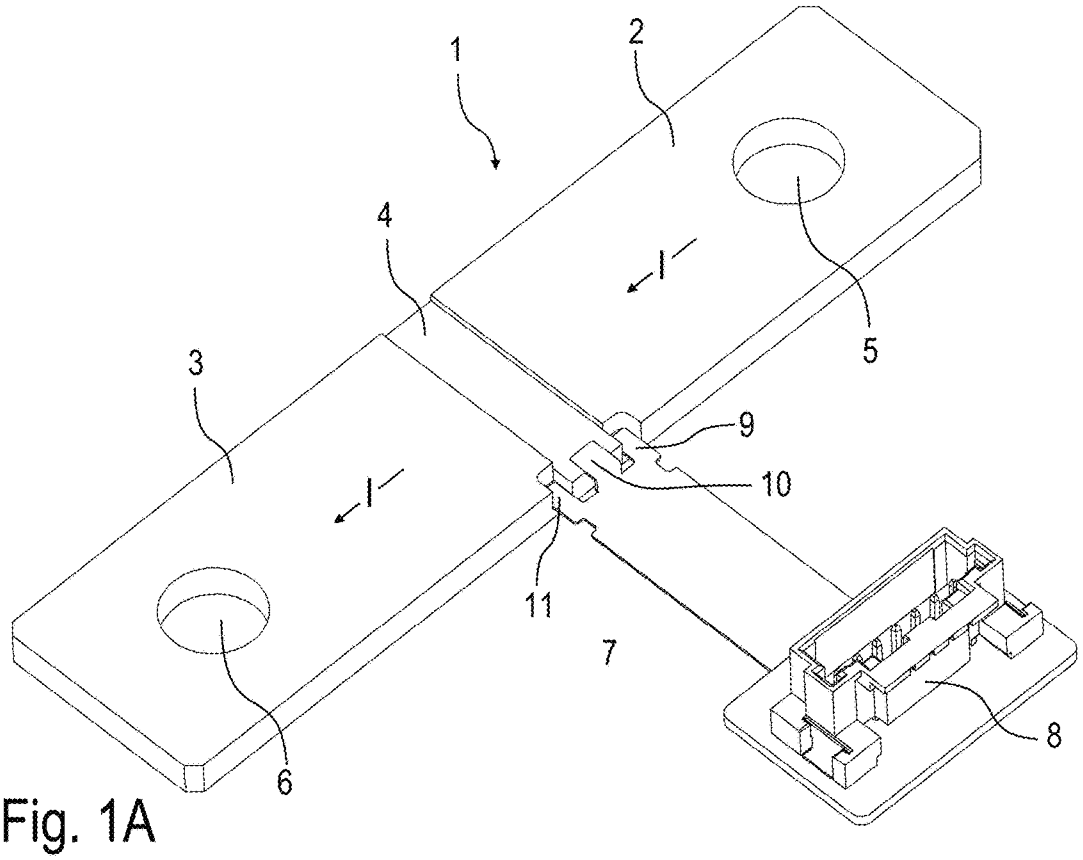
FIG. 1A shows a perspective view of a current measuring device according to the invention with a current measuring resistor, a flexible circuit board and an interface with a plug connection.
Figure 1B:
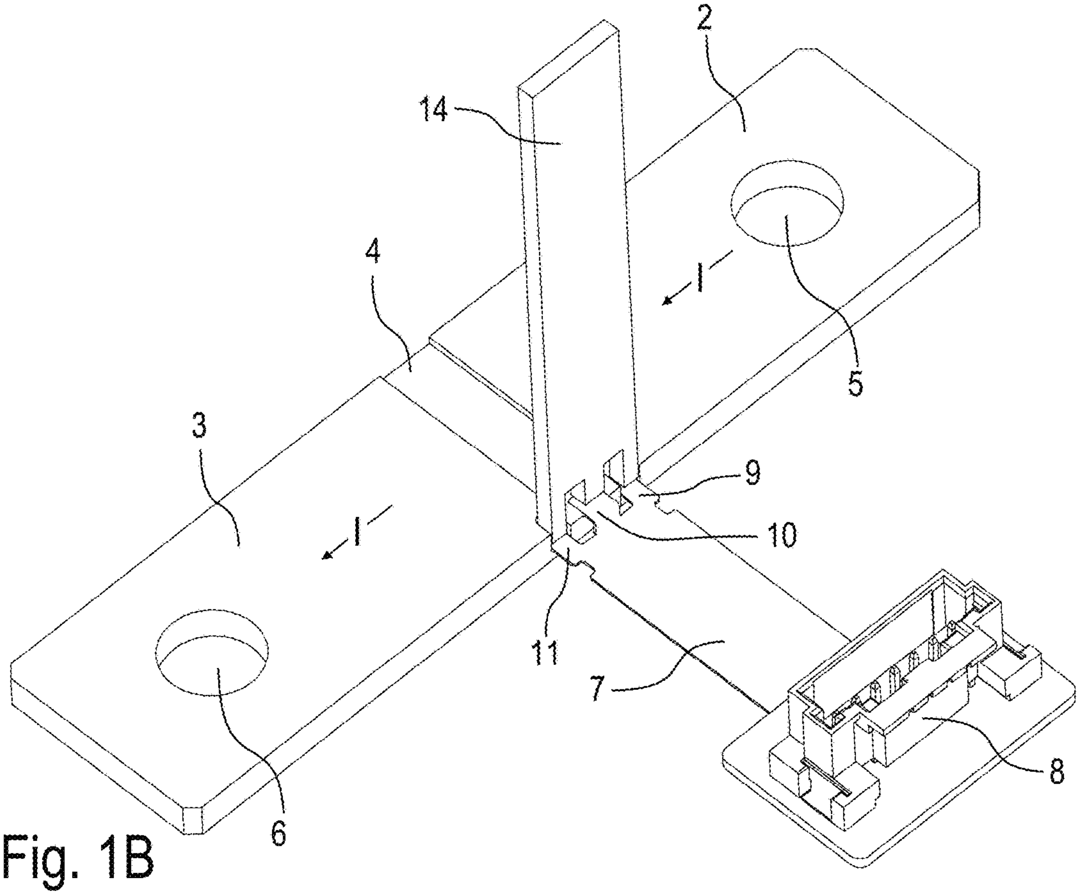
FIG. 1B shows the current measuring device from FIG. 1A with a press stamp for producing a press connection between the circuit board and the current measuring resistor.
Figure 1C:
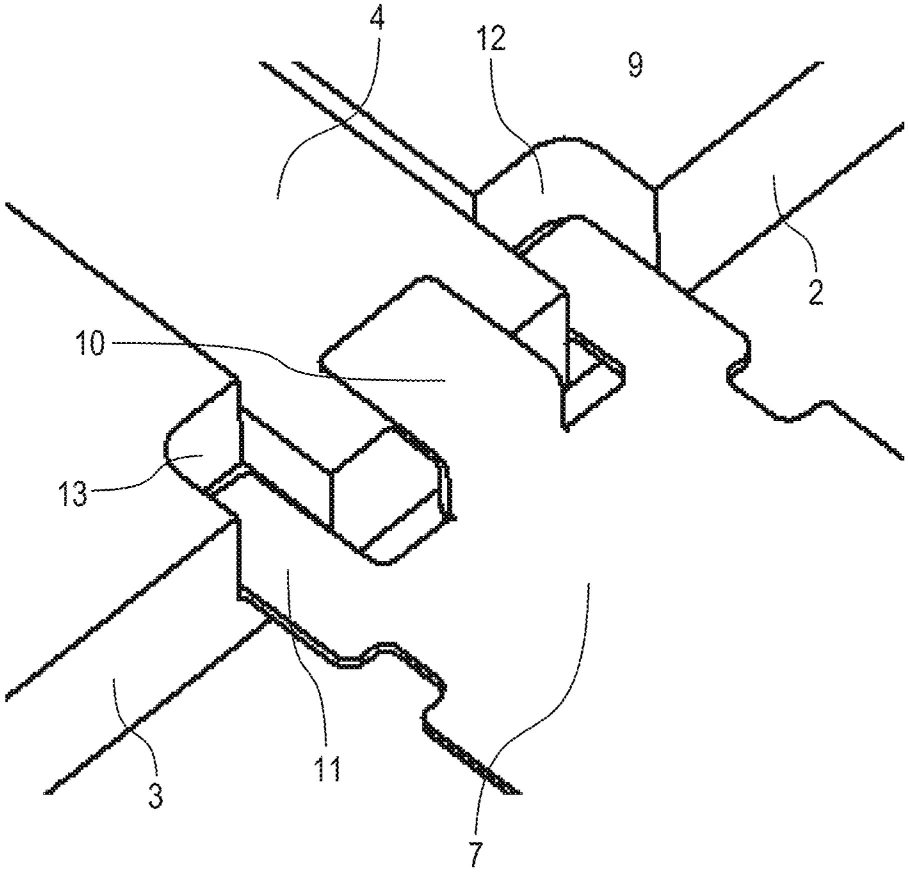
FIG. 1C shows a detailed view from FIG. 1A.

In the following, the embodiment of a current measuring device according to the invention is described, which is shown in FIGS. 1A-1C.

The invention initially comprises a low-resistance current measuring resistor 1, which consists of two connection parts 2, 3 made of a conductor material (e.g. copper) and a resistor element 4 made of a resistance material (e.g. Manganin®), whereby the resistor element 4 is arranged in the direction of current flow between the two connection parts 2, 3. The electrical current I to be measured is introduced into the current measuring resistor 1 via the connection part 2 and discharged from the current measuring resistor 1 via the connection part 3. The voltage drop across the resistor element 4 is then a measure of the electrical current I flowing through the current measuring resistor 1 in accordance with Ohm's law.

A bore 5 or 6 is arranged in each of the two connection parts 2, 3, which serves to make contact between the two connection parts 2, 3, as is known from the prior art and is also described, for example, in EP 0 605 800 B1.

In addition, the current measuring device according to the invention comprises a circuit board 7, which in this embodiment is a flexible circuit board (FPC: flexible printed circuit).

The circuit board 7 is connected to an interface 8, which is used to output measured values of the electrical voltage across the resistor element 4 of the current measuring resistor 1 to an external evaluation unit.

For this purpose, the interface 8 enables a plug connection, as is known from the prior art.

The circuit board 7 has several contact fingers 9-11 for the electrical contacting of the current measuring resistor 1. The contact finger 9 is used to make electrical contact with the connection part 2, while the contact finger 11 is used to make electrical contact with the other connection part 3. The center contact finger 10, on the other hand, is used to make electrical contact with the resistor element 4 and thus enables a center tap.

The contact fingers 9-11 protrude from the same side of the circuit board 7 and project in the same direction. For example, the contact fingers 9-11 can be produced by making slots in the circuit board 7.

There is a recess 12 in the connection part 2 to accommodate the contact finger 9. There is also a corresponding recess 13 in the other connection part 3 to accommodate the other contact finger 11. The two recesses 12, 13 extend from the same side edge of the current measuring resistor 1 and are directly adjacent to the resistor element 4. However, it should be mentioned here that there is also the alternative possibility that the two recesses 12, 13 extend into the resistor element 4. In the area of the recesses 12, 13, the two connection parts 2, 3 have a reduced thickness. It should be mentioned here that the temperature coefficient (TCR) of the resistance value of the current measuring resistor 1 can be adjusted by reducing the thickness in the area of the recesses 12, 13, as will be described later.

It should also be mentioned that the contact fingers 9-11 each contact the connection parts 2, 3 or the resistor element 4 on their upper side. This means that the contact finger 10 rests on the upper side of the resistor element 4, while the other contact fingers 9, 11 rest on the upper side of the connection parts 2, 3 in the area of the recesses 12, 13.

When the current measuring resistor 1 is electrically contacted by the circuit board 7, the contact fingers 9-11 are first positioned in the position shown in FIG. 1A.

A press connection is then created by placing a pressing plunger 14 on the ends of the contact fingers 9-11 and then pressing on the ends of the contact fingers 9-11 with a pressing force. The pressing force is so great that a press connection is created between the contact fingers 9-11 on the one hand and the connection parts 2, 3 or the resistor element 4 on the other. This press connection can be either a press-adhesive connection or a press-sinter connection, as will be described in detail.

The schematic representations according to FIGS. 2-5 are now described below, which largely correspond to the embodiment described above and shown in FIGS. 1A-1C, so that reference is made to the above description in order to avoid repetitions, whereby the same reference symbols are used for corresponding details.

It can be seen from the illustrations that the connection parts 2, 3 are connected to the resistor element 4 by a weld seam 15, as is also known, for example, from EP 0 605 800 B1.

Furthermore, not only the upper pressing plunger 14 is shown in the drawings, but also a lower pressing plunger 16, so that a pressing force is exerted both from above and from below when the press connection is produced.

Figure 2:
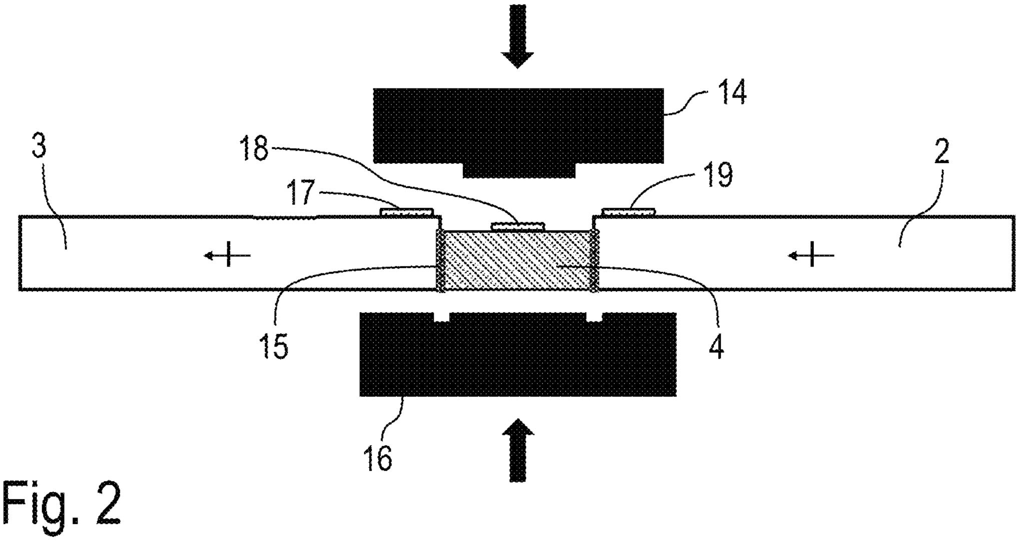
FIG. 2 shows a schematic side view of a current measuring resistor according to the invention during a pressing process.
Figure 3:
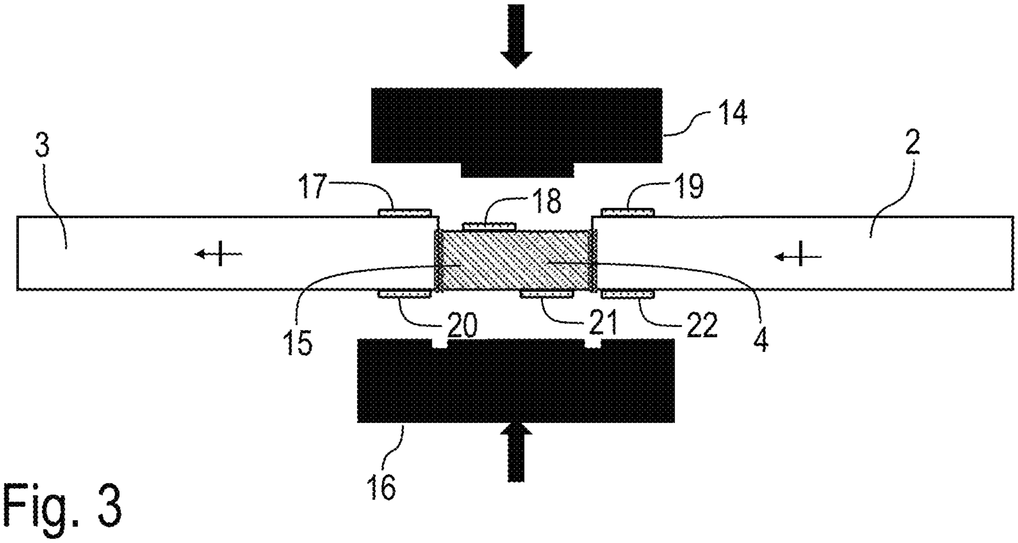
FIG. 3 shows a modification of FIG. 2.

In the invention variants according to FIGS. 2 and 3, the press connection is a press-sinter connection. In this case, heat is applied during the pressing process in order to enable the sintering process.

In the invention variant according to FIG. 2, three connection areas 17-19 are shown, all of which are arranged on the upper side of the current measuring resistor 1.

In the variant of the invention according to FIG. 3, however, three additional connection areas 20-22 are provided, all of which are arranged on the underside of the current measuring resistor.

Figure 4:
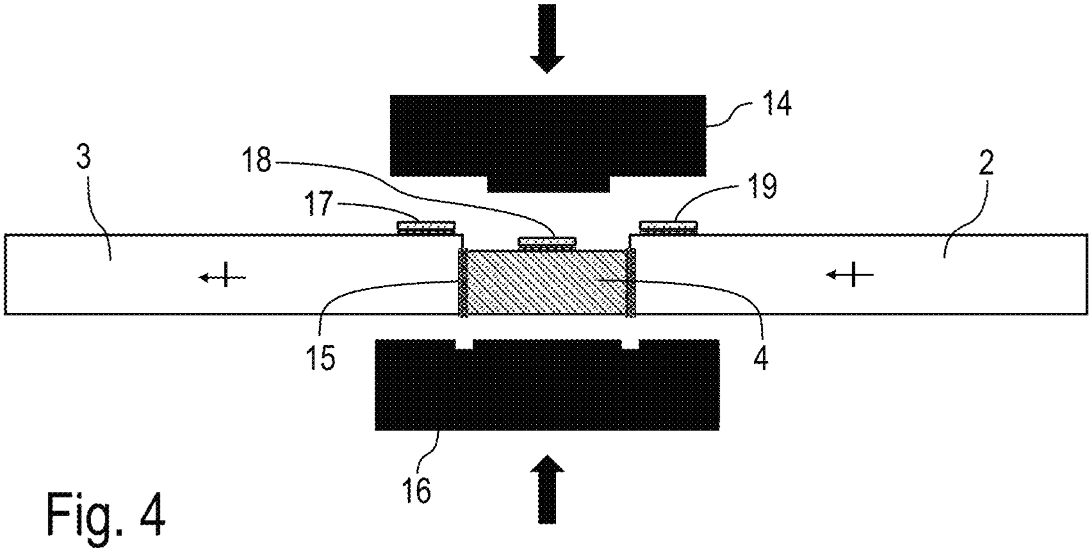
FIG. 4 shows a schematic representation of a current measuring resistor according to the invention in a press-adhesive connection.

The embodiment according to FIG. 4 largely corresponds to the embodiment according to FIG. 2. However, in this case the press connection is made without heat input as a press-adhesive connection. There is therefore an epoxy adhesive under the connection areas 17-19.

Figure 5:
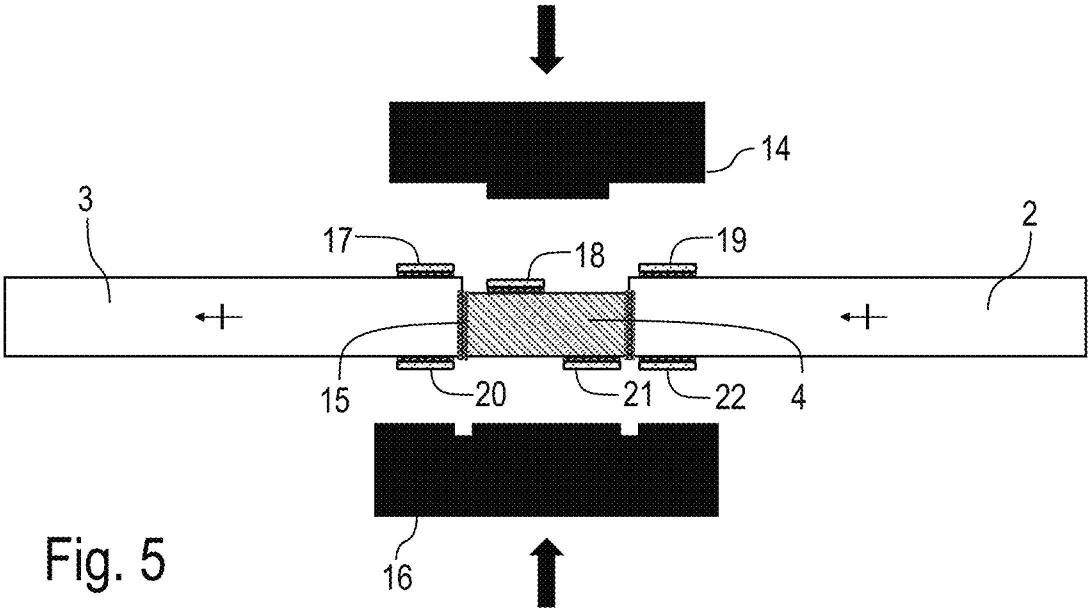
FIG. 5 shows a modification of FIG. 3.

The embodiment according to FIG. 5 largely corresponds to the embodiment according to FIG. 3. However, in this case there is also no press-sintered connection, but a press-adhesive connection without heat input. There is therefore an epoxy adhesive under the connection areas 17-22, as is also the case in the embodiment shown in FIG. 4.

The embodiment according to FIG. 6 again corresponds in part to the embodiments described above, so that reference is made to the above description in order to avoid repetition, whereby the same reference signs are used for corresponding details.

A special feature of this embodiment is that a temperature sensor 23 is additionally arranged on the circuit board 7, which measures the temperature at the resistor element 4. This makes it possible to take into account the temperature dependence of the resistance value of the resistor element 4 when calculating the current I flowing through the current measuring resistor 1 from the measured voltage, which allows temperature compensation.

The embodiment according to FIG. 7 again largely corresponds to the embodiments described above, so that reference is made to the above description in order to avoid repetition, whereby the same reference symbols are used for corresponding details.

A special feature of this design example is that several additional electronic components are arranged on the circuit board 7, namely an analog/digital converter 24, a microprocessor 25 and a component 26 with an insulation path 27 for potential-separated data transmission. The component 26 for potential-separated data transmission is located between the microprocessor 25 and the interface 8.

Figure 7:
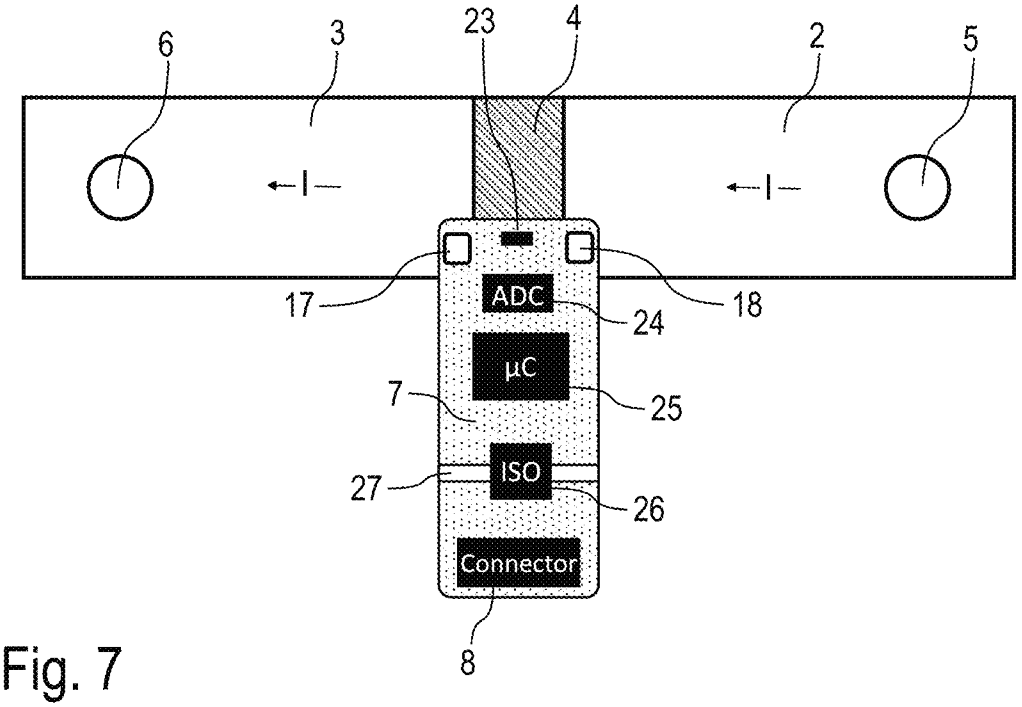
FIG. 7 shows a modification of FIG. 6, whereby additional components are mounted on the circuit board.
Figure 8:
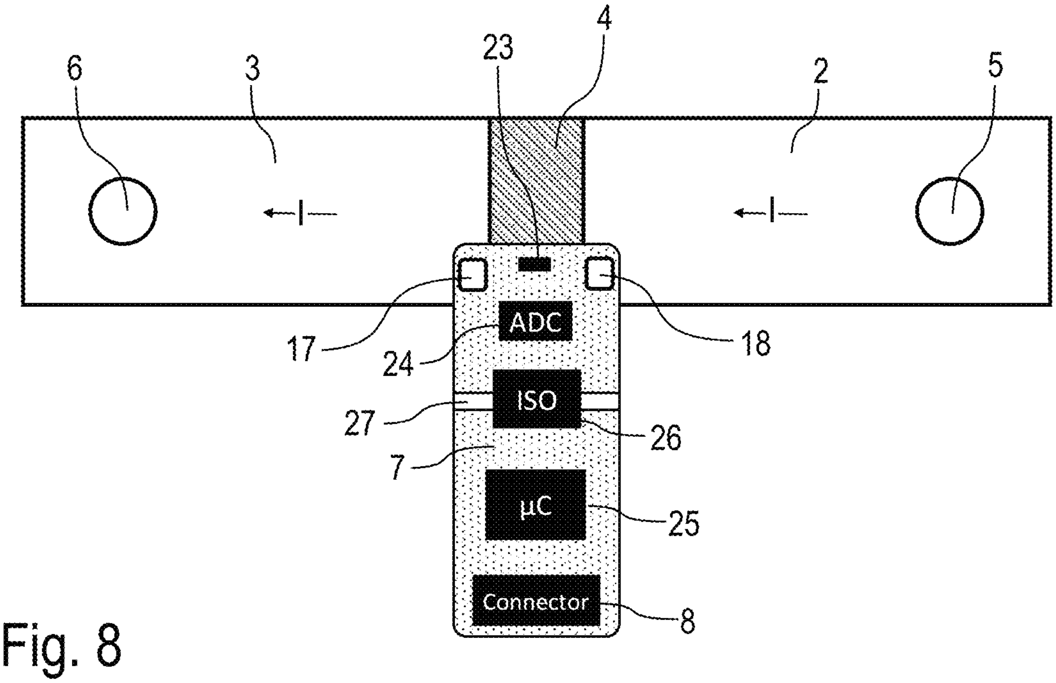
FIG. 8 shows a modification of FIG. 7.

The embodiment example shown in FIG. 8 largely corresponds to the embodiment described above and illustrated in FIG. 7, so that reference is made to the above description and the same reference signs are used in order to avoid repetition.

A special feature of this embodiment is that the component 26 for potential-separated data transmission is located between the analog/digital converter 24 and the microprocessor 25.

Figure 6:
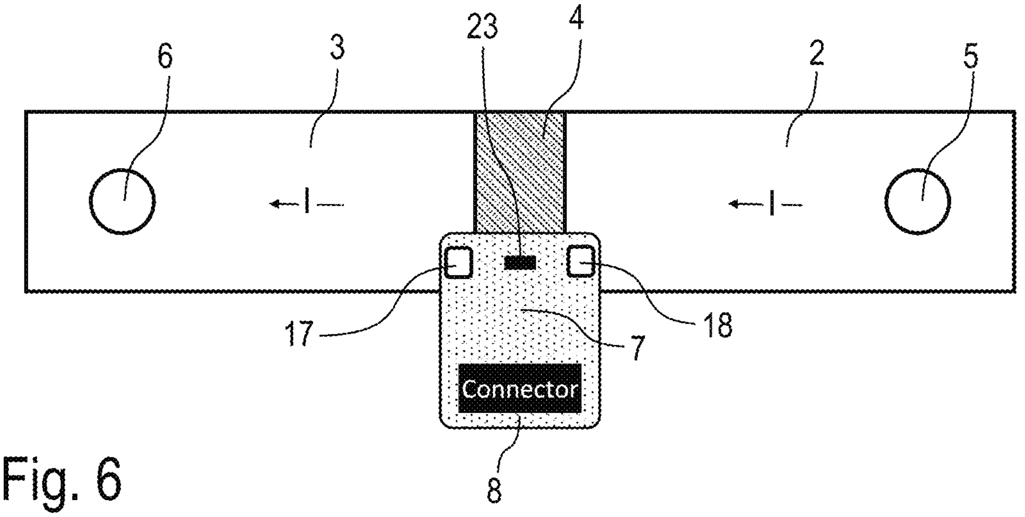
FIG. 6 shows a top view of another embodiment of a current measuring device according to the invention.
Figure 9:
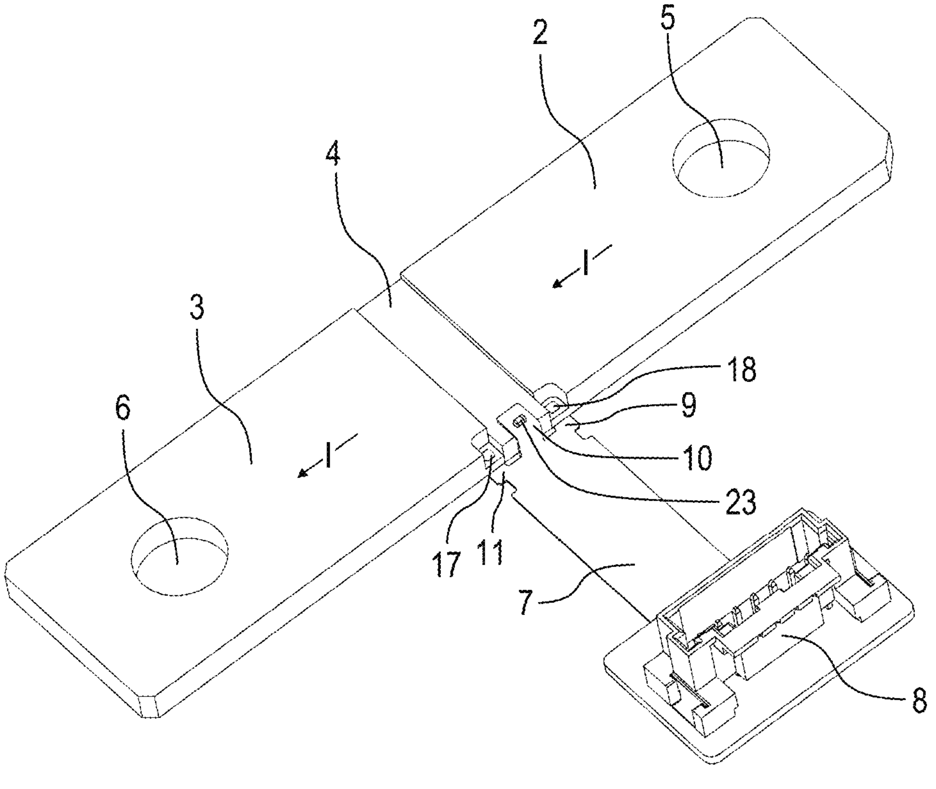
FIG. 9 shows a modification of FIG. 1A, whereby the current measuring resistor is contacted on the upper side and on the lower side.

FIG. 9 shows a perspective view of the embodiment according to FIGS. 6-8, so that reference is made to the above description in order to avoid repetition.

Figure 10:
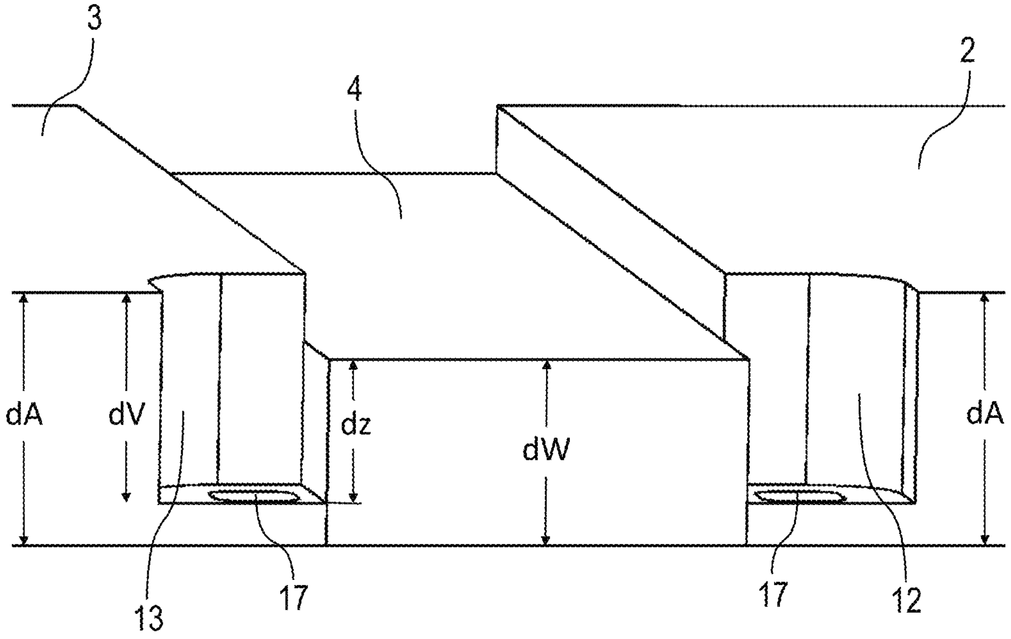
FIG. 10 shows a schematic detailed view of a current measuring resistor according to the invention with recesses in the area of the connection parts for contact fingers of the circuit board.

FIG. 10 shows a detailed perspective view of the current measuring resistor according to the invention in the area of the recesses 12, 13.

It can be seen from this that the connection parts 2, 3 each have a specific thickness dA, while the resistor element 4 has a reduced thickness dW. In the area of the recesses 12, 13, the thickness of the connection parts 2, 3 is reduced, whereby the recesses 12, 13 have a depth dV. The temperature coefficient TCR of the current measuring resistor 1 can also be adjusted by setting the depth dV.

Figure 11:
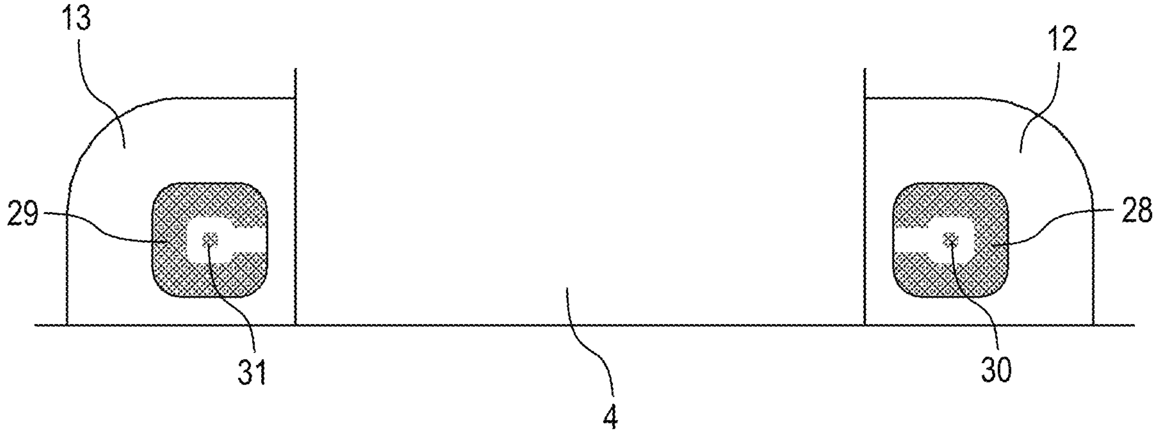
FIG. 11 shows a schematic view of a current measuring resistor according to the invention with press connections for an electrical connection and decoupled press connections for a mechanical connection.

FIG. 11 shows a schematic top view of a current measuring resistor 1 according to the invention.

In each of the recesses 12, 13 there is a mechanical connection area 28, 29, which is only used for the mechanical connection between the circuit board 7 and the current measuring resistor 1. In the mechanical connection areas 28, 29, the surface of the joining partners has a material elevation which is subjected to pressure during the press connection and thus creates a press connection, whereby this material elevation is electrically decoupled.

In addition, there is an electrical connection area 30, 31 in each of the recesses 12, 13 for establishing an electrical connection.

It should be mentioned here that the mechanical connection areas 28, 29 on the one hand and the electrical connection areas 30, 31 on the other hand are spatially separated and electrically decoupled.

Figure 12:
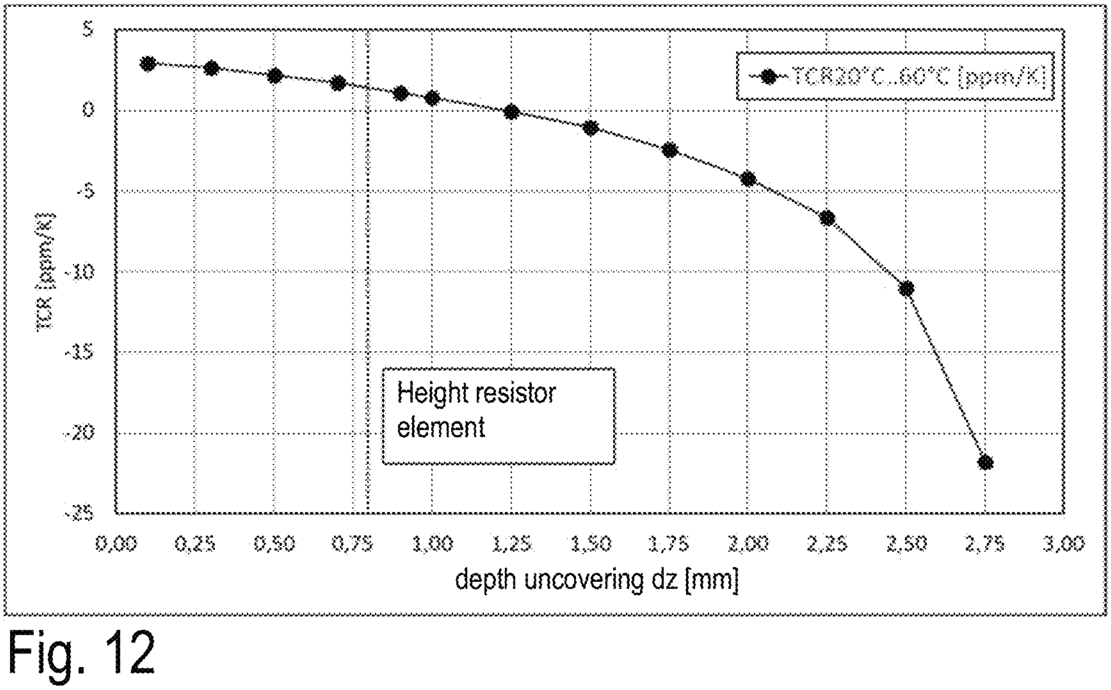
FIG. 12 shows a diagram to illustrate the temperature coefficient of the electrical resistance value as a function of the depth of the indentations (clearances).

Finally, FIG. 12 shows a diagram illustrating the temperature coefficient TCR as a function of the depth dZ of the recesses 12, 13 in the connection parts 2, 3 of the current measuring resistor 1. The diagram clearly shows that the temperature coefficient TCR can be adjusted by setting the depth dZ of the recesses 12, 13.

Figure 13:
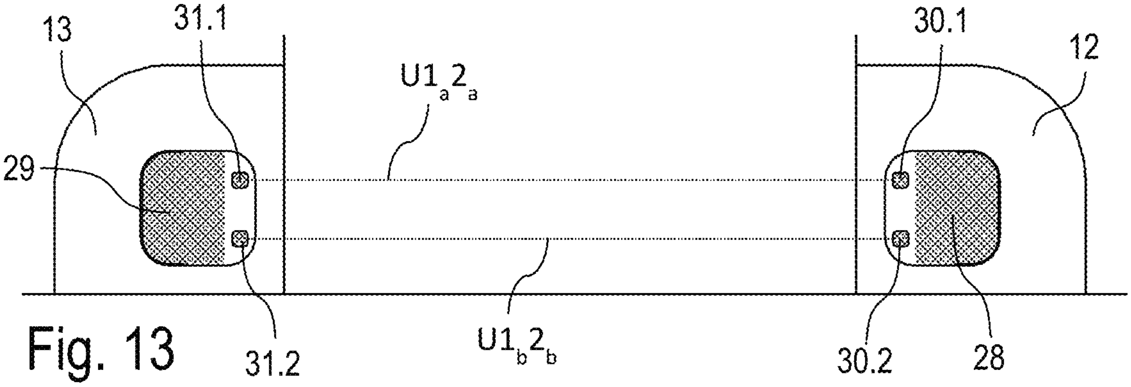
FIG. 13 shows a schematic representation of a current measuring resistor according to the invention with two parallel measuring channels.
Figure 14:
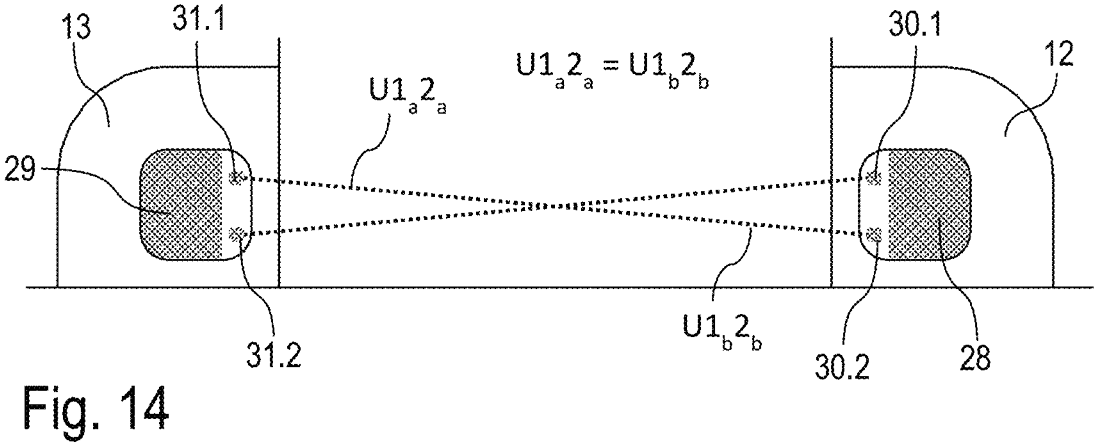
FIG. 14 shows a modification of FIG. 13, whereby the measuring points of the two measuring channels are arranged crosswise.

FIGS. 13 and 14 show two variants of the invention, each with four electrical connection areas 30.1, 30.2, 31.1, 31.2, which form two measuring channels in pairs.

In the invention variant according to FIG. 13, the measuring channels are arranged in parallel, as is known, for example, from WO 2014/161624 A1. In the invention variant according to FIG. 14, on the other hand, the measuring channels are arranged crosswise, as is known, for example, from DE 10 2021 103 241.5.

Figure 15:
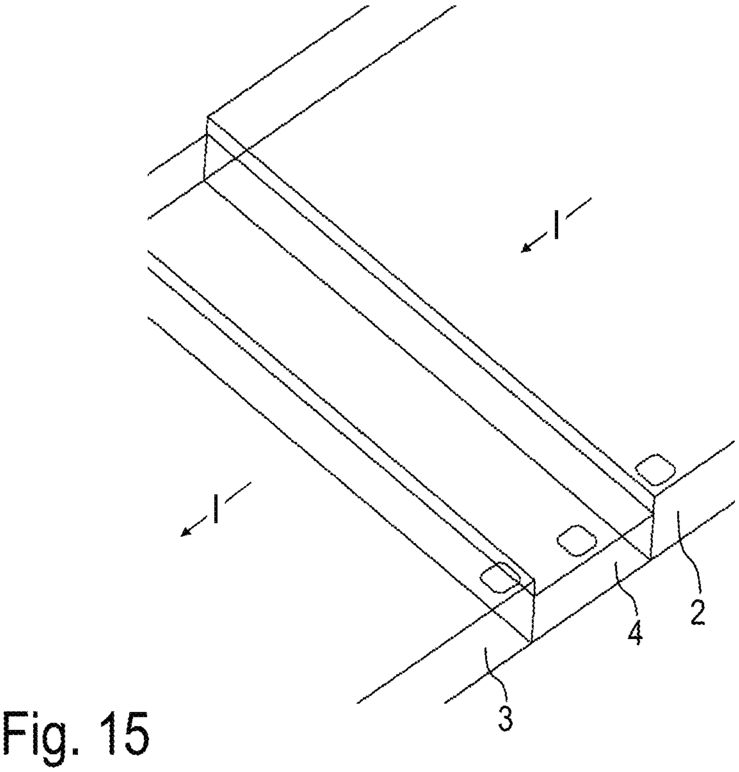
FIG. 15 shows a perspective view of a current measuring resistor according to the invention with two voltage taps on the connection parts and a center tap on the resistor element.
Figure 16:
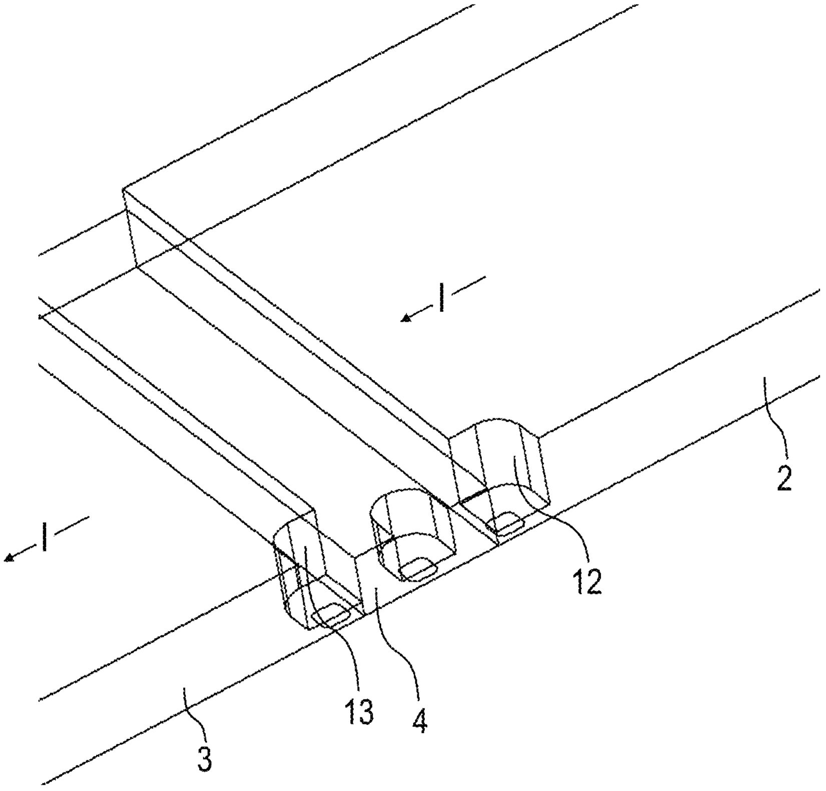
FIG. 16 shows a modification of FIG. 15 with recesses at the respective connection points.

FIGS. 15 and 16 again show perspective views of different variants of the invention without the recesses in the connection parts (FIG. 15) or with the recesses 12, 13 in the connection parts 2, 3 (FIG. 16).

Figure 17:
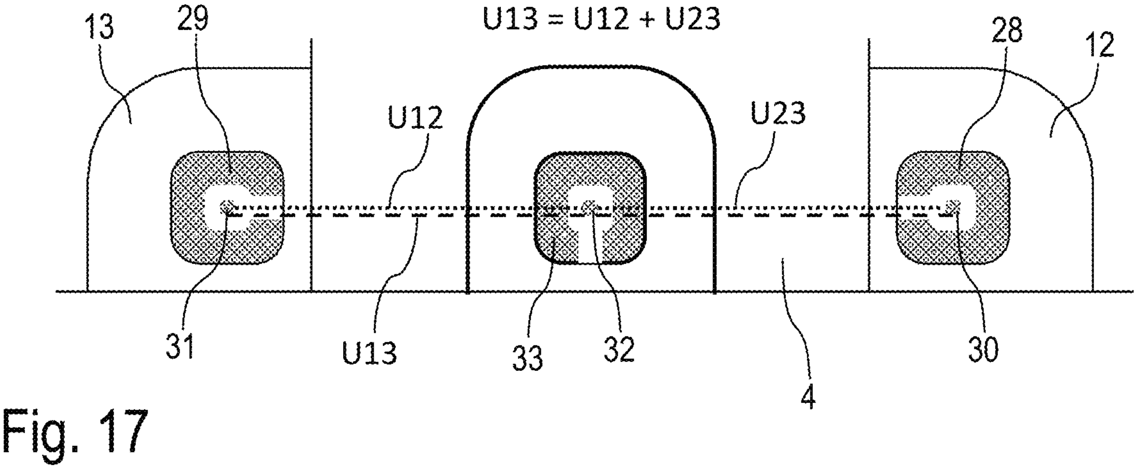
FIG. 17 shows a modification of FIG. 11 with an additional center tap on the resistor element.

FIG. 17 shows a schematic representation corresponding to FIG. 11 with an additional center tap comprising an electrical connection area 32 and a mechanical connection area 33.

Figure 18:
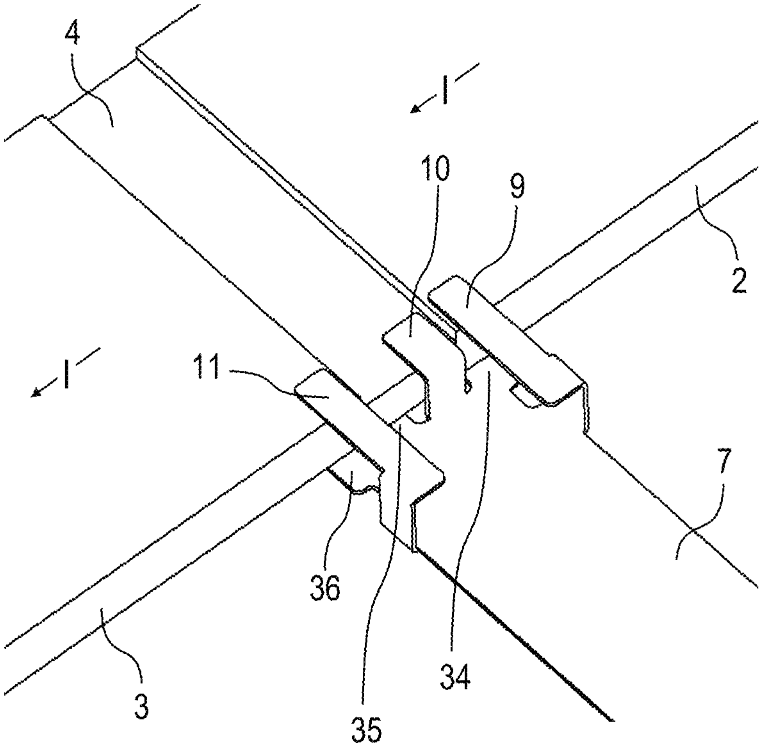
FIG. 18 shows a modification of FIG. 1C, whereby the current measuring resistor is contacted by contact fingers on the underside and on the upper side.
Figure 19:
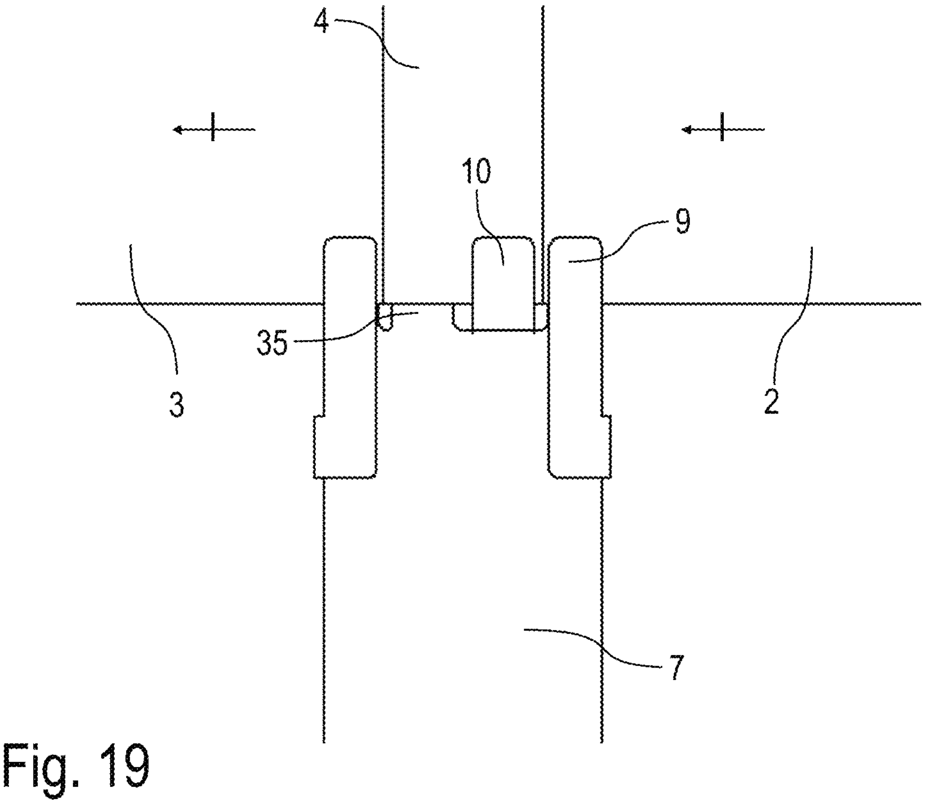
FIG. 19 shows a top view of the design example shown in FIG. 18.

FIGS. 18 and 19 show different views of a current measuring resistor 1 according to the invention with a total of six contact fingers 9-11, 34-36. The contact fingers 9-11 contact the current measuring resistor 1 on its upper side, while the other contact fingers 34-36 contact the current measuring resistor 1 on its underside.

Figure 20:
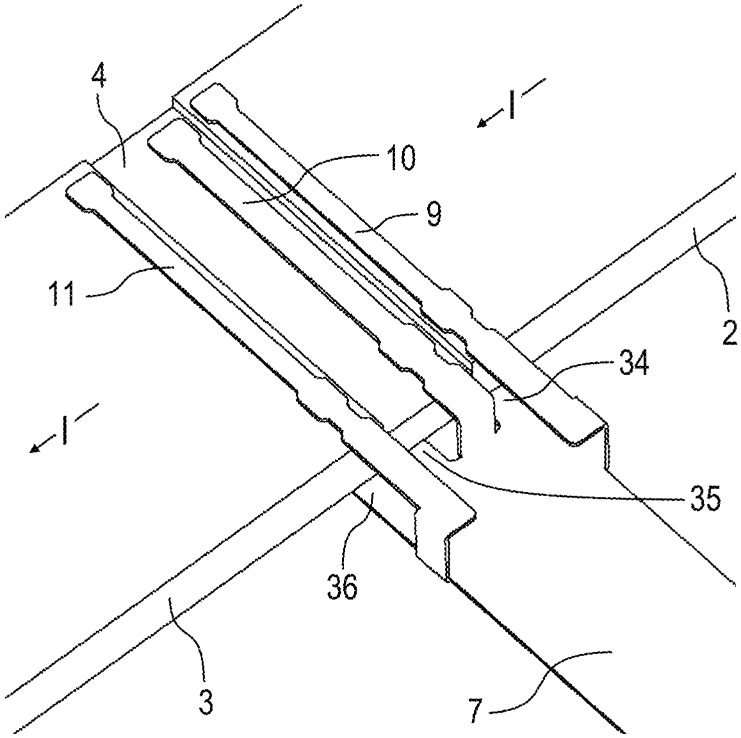
FIG. 20 shows an embodiment in which the contact fingers of the circuit board extend across the entire width of the current measuring resistor in order to enable voltage measurement at various points.

FIG. 20 shows a variation in which the contact fingers 9-11, 34-36 extend across the entire width of the current measuring resistor 1 and enable voltage measurement at various points.

The flow chart shown in FIG. 21, which explains the invention variant with a press-sinter connection, is now described below.

In a first step S1, a current measuring resistor with a resistor element and two connection parts is first provided.

In a second step S2, the recesses described above are then formed in the connection parts and optionally in the resistor element of the current measuring resistor, which can be done by milling, for example.

In the next step S3, a circuit board is then provided and contact fingers are formed in the circuit board in a step S4, which are used to make contact with the current measuring resistor.

In the next step S5, the connection points of the current measuring resistor can be nano-structured.

The current measuring resistor and the circuit board are then joined together in step S6 so that the contact fingers of the circuit board lie in the recesses and/or on the back of the recesses.

In the next step S7, the connection points are then heated to a sintering temperature that is sufficient to produce a press-sinter connection.

In the next step S8, the circuit board and the current measuring resistor are then pressed together at the connection points to create the desired press-sinter connection.

Figure 21:
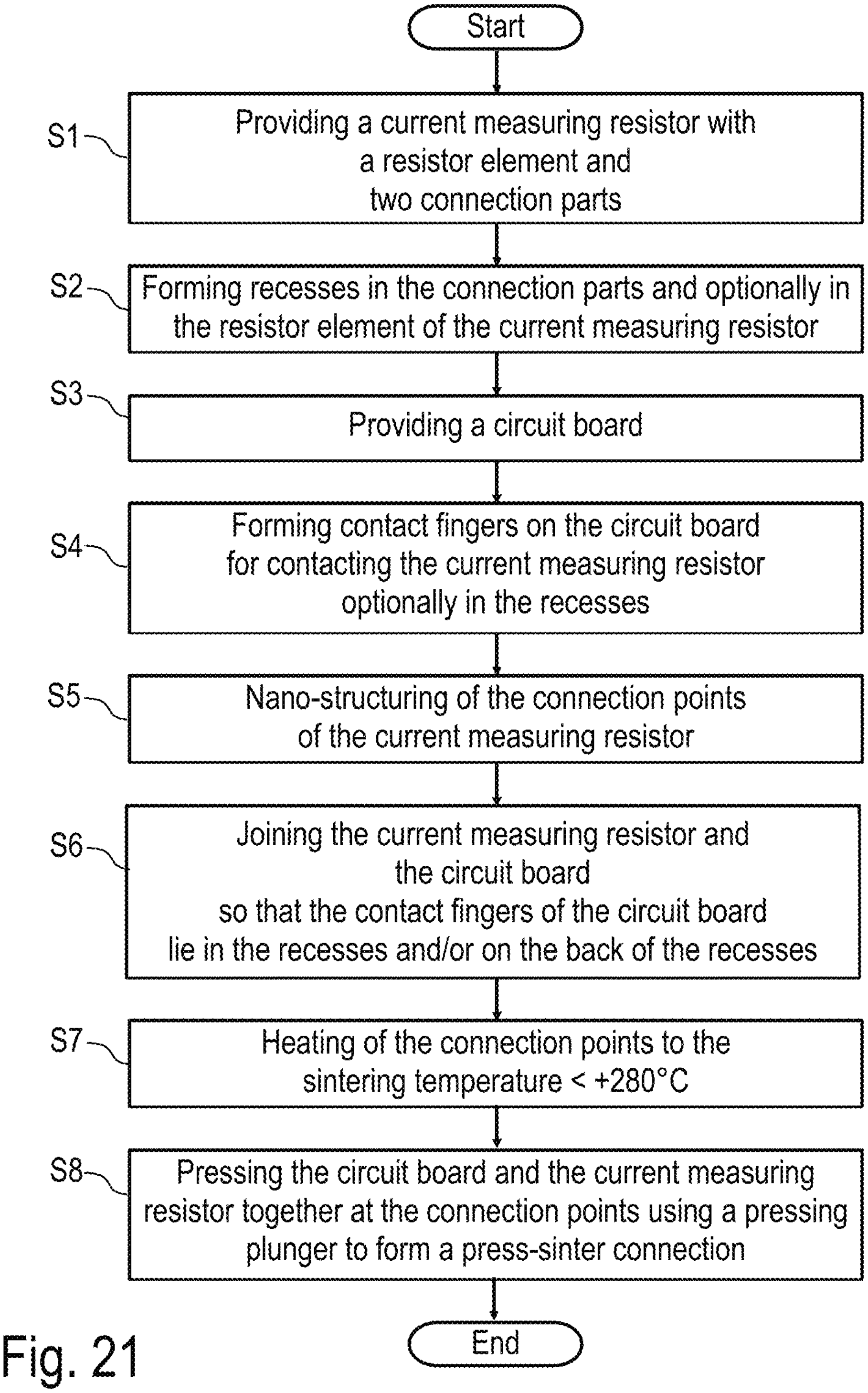
FIG. 21 shows a flow chart to illustrate the manufacturing process according to the invention for creating a press-sinter connection.
Figure 22:
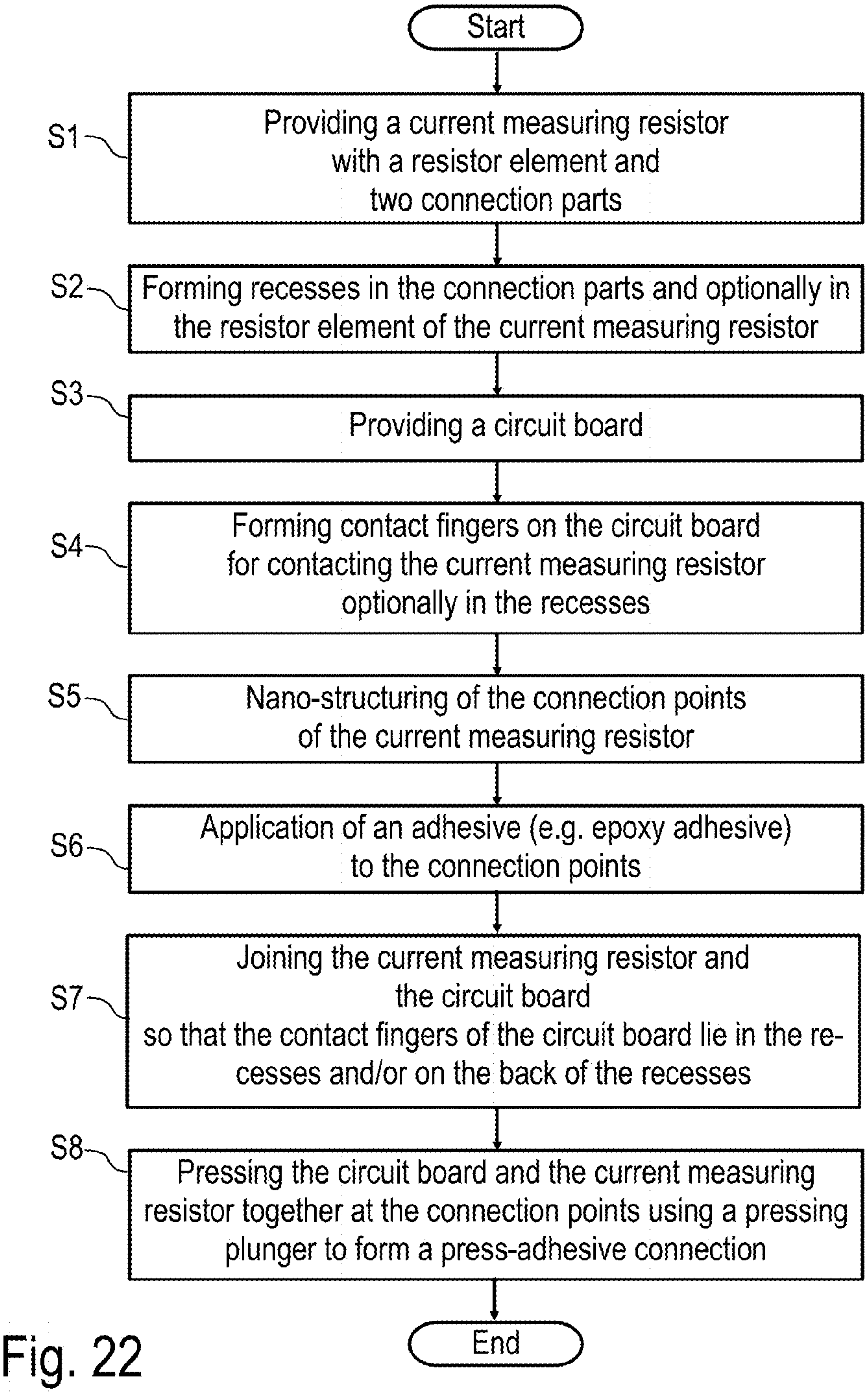
FIG. 22 shows a flow chart illustrating the manufacturing process according to the invention for producing a press-adhesive connection.

FIG. 22 shows a modification of FIG. 21, so that reference can be made to the above description to avoid repetition. In contrast to the flow diagram in FIG. 21, however, a press-adhesive connection is used here instead of a press-sintered connection. Therefore, no heat is applied during the pressing process. Instead, in step S6, an adhesive (e.g. epoxy adhesive) is applied to the connection points.

The invention is not limited to the preferred embodiments described above. Rather, a large number of variants and modifications are possible which also make use of the inventive concept and therefore fall within the scope of protection. In particular, the invention also claims protection for the subject matter and the features of the dependent claims independently of the respective claims referred to and, in particular, also without the features of the main claim. The invention thus comprises various aspects of the invention which enjoy protection independently of each other.

LIST OF REFERENCE SIGNS

- 1 Current measuring resistor
- 2 Connection part for feeding the current into the current measuring resistor
- 3 Connection part for discharging the current from the current measuring resistor
- 4 Resistor element
- 5 Bore in the connection part for introducing the current into the current measuring resistor
- 6 Bore in the connection part for discharging the current from the current measuring resistor
- 7 Circuit board
- 8 Interface on the circuit board for outputting measured values
- 9-11 Contact finger of the circuit board
- 12 Recess in the connection part for introducing the current into the current measuring resistor
- 13 Recess in the connection part for discharging the current from the current measuring resistor
- 14 Pressing plunger for pressing from above
- 15 Weld seam between the resistor element and the connection parts
- 16 Pressing plunger for pressing from below
- 17-22 Connection areas on the circuit board
- 23 Temperature sensor on the circuit board
- 24 Analog/digital converter on the circuit board
- 25 Microprocessor
- 26 Module for potential-separated data transmission
- 27 Insulation path
- 28, 29 Mechanical connection area
- 30, 31 Electrical connection area
- 30.1 30.2 Electrical connection areas
- 31.1, 31.2 Electrical connection areas
- 32 Electrical connection area on the center tap
- 33 Mechanical connection area on the center tap
- 34-36 Contact finger of the circuit board
- dW Thickness of the resistor element
- dA Thickness of the connection parts
- dV Depth of the indentation in the connection parts
- dz Depth of the recess relative to the resistor element
- I Current through the current measuring resistor

What is claimed is:

1. A current measuring device for measuring an electric current, comprising: a) a current measuring resistor with a1) a first connection part made of a conductor material for introducing the electrical current to be measured into the current measuring resistor, a2) a second connection part made of a conductor material for conducting the electrical current to be measured out of the current measuring resistor, and a3) a resistor element made of a resistance material, the resistor element being arranged in the direction of current flow between the first connection part and the second connection part, so that the electrical current to be measured flows through the resistor element, and with b) a circuit board, which is electrically connected at at least two connection points to the two connection parts of the current measuring resistor, c) wherein the connection parts of the current measuring resistor are each connected to the circuit board at the connection points via a press connection with a material bond; and wherein the circuit board is equipped with at least one of the following component:

i) an analog-to-digital converter, ii) a component for potential-separated data transmission, iii) a microprocessor, wherein the microprocessor is arranged on the high side of the component for potential-separated data transmission or on the low side of the component for potential-separated data transmission, and iv) an interface.

2. The current measuring device according to claim 1, wherein the press connection is a press-sinter connection.

3. The current measuring device according to claim 1, wherein the press-sinter connection contains an additional sinter material.

4. The current measuring device according to claim 3, wherein the additional sinter material is silver or copper.

5. The current measuring device according to claim 1, wherein the press connection is a press-adhesive connection.

6. The current measuring device according to claim 5, wherein the press-adhesive connection comprises an epoxy adhesive.

7. The current measuring device according to claim 1, wherein at least one of the connection parts and the circuit board have a surface structuring at the connection points.

8. The current measuring device according to claim 7, wherein the surface structuring contains at least one of the following materials: a) ENIG, b) ENEPIG, c) gold, d) copper, e) nickel-phosphorus, f) silver.

9. The current measuring device according to claim 1, wherein a) at least one of the press connections includes a mechanical connection and an electrical connection between the circuit board and the connection parts of the current measuring resistor, b) the mechanical connection is spatially separated from the electrical connection and electrically insulated.

10. The current measuring device according to claim 1, wherein the press connections each have a a contact finger parallel to the circuit board of at most 1 mm in order to enable precise voltage measurement at the connection parts.

11. The current measuring device according to claim 1, wherein a) the circuit board for contacting the current measuring resistor comprises a plurality of contact fingers which project from the circuit board, b) the contact fingers of the circuit board contact the current measuring resistor on its upper side and/or on its lower side, c) the current measuring resistor has recesses into each of which one of the contact fingers of the circuit board projects, d) one of the contact fingers in each case rests on the rear side of the circuit board, the current measuring resistor having a reduced thickness in the region of the recesses compared with the rest of the current measuring resistor, and e) the thickness of the connection parts in the region of the recesses is smaller than the thickness of the resistor element.

12. The current measuring device according to claim 11, wherein a) at least one of the recesses for the contact fingers of the circuit board is located in each of the connection parts of the current measuring resistor, directly adjacent to the resistor element and directly adjacent to a side edge of the first connection part, b) the recesses in the connection parts extend into the resistor element, c) at least one of the recesses for the contact fingers of the circuit board is located in the resistor element of the current measuring resistor, directly adjacent to the same side edge of the current measuring resistor, and d) at least one of the contact fingers of the circuit board is arranged on the underside of the current measuring resistor, opposite the recess.

13. The current measuring device according to claim 1, wherein a) the circuit board is equipped with at least one electrical or electronic component, and b) the component is connected to the circuit board by one of a press connection and a standard soldered connection.

14. The current measuring device according to claim 1, wherein a) the circuit board is connected at at least four connection points to the two connection parts of the current measuring resistor, b) the four connection points form a rectangle, and c) the connection points each form a plurality of measuring channels in pairs, wherein the measuring channels each measure the voltage between the two connection parts of the current measuring resistor.

15. The current measuring device according to claim 14, wherein the connection points of the two measuring channels are arranged crosswise.

16. The current measuring device according to claim 14, wherein the connection points of the two measuring channels are arranged in parallel.

17. The current measuring device according to claim 1, wherein a) the circuit board is connected at at least two of the connection points to the two connection parts of the current measuring resistor in order to measure the voltage dropping across the resistor element of the current measuring resistor, and b) the circuit board is connected to the resistor element at at least one of the connection points in order to enable a center tap on the resistor element.

18. The current measuring device according to claim 1, wherein the circuit board is connected at two of the connection points to the first connection part and at one of the connection points to the second connection part, the three connection points forming a closed voltage mesh.

19. The current measuring device according to claim 1, wherein the circuit board is one of a rigid circuit board, a flexible circuit board, and a rigid-flex circuit board which is partially rigid and partially flexible.

20. The current measuring device according to claim 1, wherein a) the current measuring resistor is of low resistance with an electrical resistance of at most 500μΩ, b) the current measuring resistor has a current carrying capacity of at least 100 A, c) the current measuring resistor is plate-shaped, d) the resistor element is plate-shaped, e) the connection parts are each plate-shaped, f) in the current measuring resistor the resistor element is connected to the connection parts by a welded joint, g) the current measuring resistor has an electrical resistance value with a temperature coefficient of at most 200 ppm/K, h) the conductor material of the connection parts of the current measuring resistor is one of copper, a copper alloy, aluminium and an aluminium alloy, i) the conductor material of the connection parts of the current measuring resistor has a lower specific electrical resistance than the resistance material of the resistor element of the current measuring resistor, j) the current measuring resistor has a length in the main current flow direction which is in the range of 5 mm-200 mm, k) the current measuring resistor has a width transverse to the main current flow di-reaction which is in the range of 10 mm-100 mm, 1) the current measuring resistor has a thickness transverse to the main current flow direction which is in the range of 1 mm-5 mm, and m) the press connections each have an electrical contact resistance which is less than 1μΩ/mm·sup·2.

21. A current measuring device for measuring an electric current, comprising: a) a current measuring resistor with a1) a first connection part made of a conductor material for introducing the electrical current to be measured into the current measuring resistor, a2) a second connection part made of a conductor material for conducting the electrical current to be measured out of the current measuring resistor, and a3) a resistor element made of a resistance material, the resistor element being arranged in the direction of current flow between the first connection part and the second connection part, so that the electrical current to be measured flows through the resistor element, and with b) a circuit board, which is electrically connected at at least two connection points to the two connection parts of the current measuring resistor, c) wherein the connection parts of the current measuring resistor are each connected to the circuit board at the connection points via a press connection with a material bond and wherein the circuit board contains an interface in order to transmit to an external evaluation unit via the interface, the interface being an analog interface: a) measured values of the voltage dropping between the connection parts and b) measured values of a temperature sensor arranged on the circuit board.

22. A current measuring device for measuring an electric current, comprising: a) a current measuring resistor with a1) a first connection part made of a conductor material for introducing the electrical current to be measured into the current measuring resistor, a2) a second connection part made of a conductor material for conducting the electrical current to be measured out of the current measuring resistor, and a3) a resistor element made of a resistance material, the resistor element being arranged in the direction of current flow between the first connection part and the second connection part, so that the electrical current to be measured flows through the resistor element, and with b) a circuit board, which is electrically connected at at least two connection points to the two connection parts of the current measuring resistor, c) wherein the connection parts of the current measuring resistor are each connected to the circuit board at the connection points via a press connection with a material bond and wherein i) the circuit board carries an evaluation unit which calculates the electrical current flowing through the current measuring resistor from the measured values of the voltage dropping between the connection parts, ii) the evaluation unit is connected to a temperature sensor and takes the temperature into account when calculating the current flowing through the current measuring resistor for temperature correction, and iii) the circuit board includes a digital interface, which is connected to the evaluation unit on the circuit board in order to output the electrical current calculated by the evaluation unit.

* * * * *